US009892990B1

(12) United States Patent
Galloway et al.

(10) Patent No.: US 9,892,990 B1
(45) Date of Patent: Feb. 13, 2018

(54) SEMICONDUCTOR PACKAGE LID THERMAL INTERFACE MATERIAL STANDOFFS

(71) Applicant: Amkor Technology, Inc., Chandler, AZ (US)

(72) Inventors: Jesse E. Galloway, Chandler, AZ (US); Paul Mescher, Chandler, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 14/339,633

(22) Filed: Jul. 24, 2014

(51) Int. Cl.
| H01L 23/34 | (2006.01) |
| H01L 21/48 | (2006.01) |
| H01L 23/36 | (2006.01) |
| H01L 23/538 | (2006.01) |
| H01L 23/367 | (2006.01) |
| H01L 23/498 | (2006.01) |
| H01L 25/065 | (2006.01) |
| H01L 23/00 | (2006.01) |

(52) U.S. Cl.
CPC ............ *H01L 23/34* (2013.01); *H01L 21/486* (2013.01); *H01L 21/4871* (2013.01); *H01L 23/36* (2013.01); *H01L 23/3675* (2013.01); *H01L 23/49816* (2013.01); *H01L 23/5384* (2013.01); *H01L 24/81* (2013.01); *H01L 25/0655* (2013.01)

(58) Field of Classification Search
CPC . H01L 21/768; H01L 23/36; H01L 23/49827; H01L 23/3675; H01L 23/147; H01L 24/83; H01L 24/81
See application file for complete search history.

(56) References Cited

U.S. PATENT DOCUMENTS

| 7,388,284 B1* | 6/2008 | Zhang ........................... 257/704 |
| 8,362,609 B1* | 1/2013 | Dosdos ................... H01L 23/16 |
| | | 257/690 |
| 2004/0075987 A1* | 4/2004 | Shim, II .............. H01L 21/4878 |
| | | 361/704 |
| 2004/0190259 A1* | 9/2004 | Labanok et al. .............. 361/704 |
| 2008/0006934 A1* | 1/2008 | Zhao et al. .................. 257/713 |
| 2011/0149537 A1* | 6/2011 | Kurosawa ..................... 361/760 |
| 2011/0291258 A1* | 12/2011 | Murayama et al. .......... 257/712 |

(Continued)

FOREIGN PATENT DOCUMENTS

WO    WO 2013/089780    * 6/2013

*Primary Examiner* — A. Sefer
(74) *Attorney, Agent, or Firm* — McAndrews, Held & Malloy, Ltd.

(57) ABSTRACT

Semiconductor package lid thermal interface material standoffs are disclosed and may include a substrate, a semiconductor die bonded to the substrate, a package lid bonded to the substrate and the semiconductor die thermal interface material in contact the semiconductor die, and standoffs that define a distance between the package lid and the substrate. The package lid may comprise thermal conducting material. The standoff may be within a portion of the thermal interface material. The package lid may provide a hermetic seal with the substrate. A passive device may be bonded to the substrate and covered by the package lid. A standoffs may also be formed on portions of the lid that are not in contact with the substrate. The standoff may be formed on four edges of the package lid. The standoff may comprise structures pressed into the lid.

19 Claims, 5 Drawing Sheets

(56) References Cited

U.S. PATENT DOCUMENTS

2012/0049341 A1\* 3/2012 Bezama et al. ............... 257/713
2013/0270691 A1\* 10/2013 Mallik et al. .................. 257/713
2015/0357258 A1\* 12/2015 Fitzgerald ........... H01L 23/3675
　　　　　　　　　　　　　　　　　　　　　　　　257/713

\* cited by examiner

US 9,892,990 B1

SEMICONDUCTOR PACKAGE LID THERMAL INTERFACE MATERIAL STANDOFFS

FIELD

Certain embodiments of the disclosure relate to semiconductor chip packaging. More specifically, certain embodiments of the disclosure relate to a method and system for semiconductor package lid thermal interface material standoffs.

BACKGROUND

Semiconductor packaging protects integrated circuits, or chips, from physical damage and external stresses. In addition, it can provide a thermal conductance path to efficiently remove heat generated in a chip, and also provide electrical connections to other components such as printed circuit boards, for example. Materials used for semiconductor packaging typically comprise ceramic or plastic, and form-factors have progressed from ceramic flat packs and dual in-line packages to pin grid arrays and leadless chip carrier packages, among others.

Further limitations and disadvantages of conventional and traditional approaches will become apparent to one of skill in the art, through comparison of such systems with the present disclosure as set forth in the remainder of the present application with reference to the drawings.

DETAILED DESCRIPTION

Certain aspects of the disclosure may be found in semiconductor package lid thermal interface material standoffs. Example aspects of the disclosure may comprise a substrate, one or more semiconductor die bonded to the substrate, and a lid bonded to the substrate and the one or more semiconductor die, wherein the lid comprises pre-applied thermal interface material and standoffs that define a distance between the lid and the substrate. The lid may comprise metal. The standoffs may be within a portion of the pre-applied thermal interface material. The lid may provide a hermetic seal with the substrate. One or more passive devices may be bonded to the substrate and covered by the lid. Standoffs may also be formed on portions of the lid that are not in contact with the substrate. The standoffs may be formed on four edges of the lid. The standoffs may comprise structures pressed into the lid.

Figure 1:
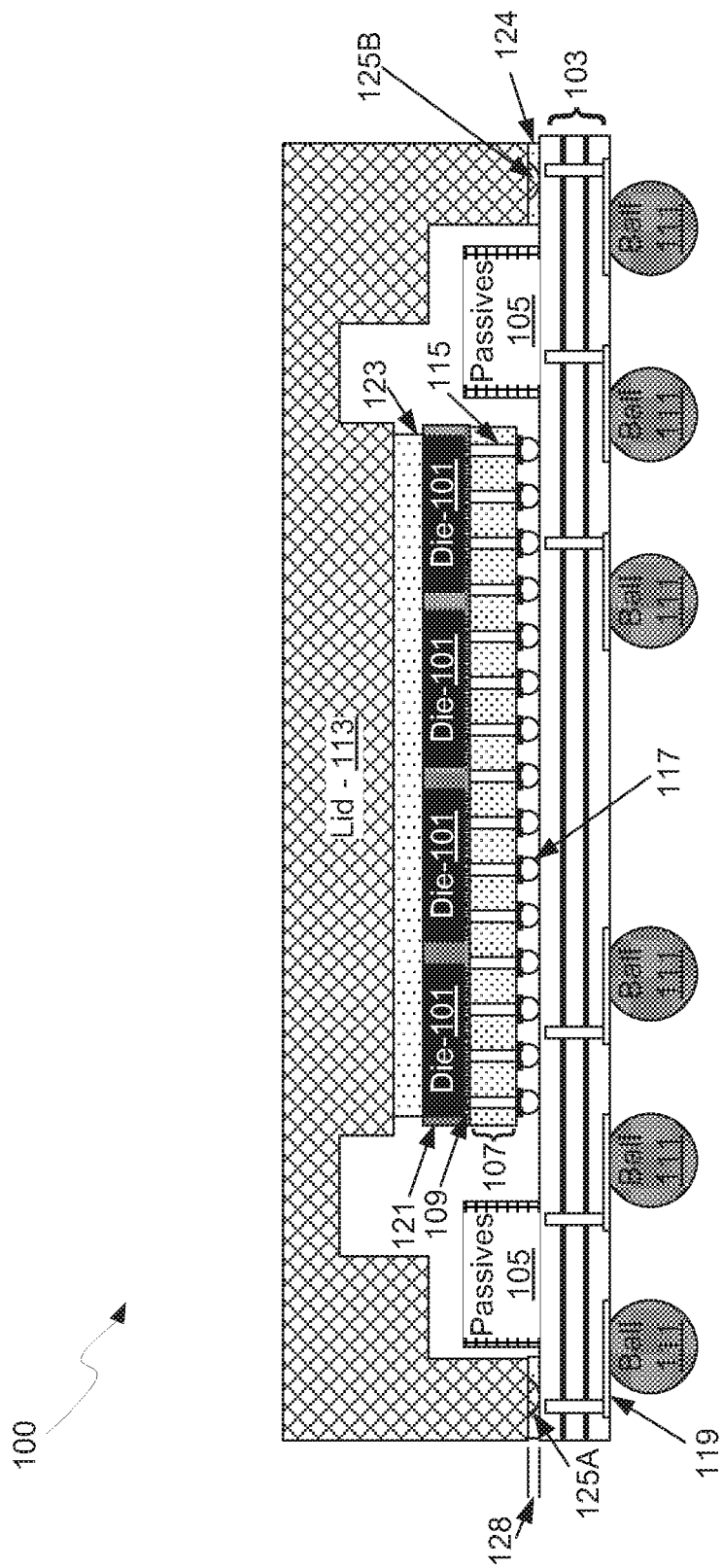
FIG. 1 is a cross-section illustrating an integrated circuit package configured with lid thermal interface material standoffs, in accordance with an example embodiment of the disclosure.

FIG. 1 is a cross-section illustrating an integrated circuit package configured with lid thermal interface material standoffs, in accordance with an example embodiment of the disclosure. Referring to FIG. 1, there is shown a package 100 comprising die 101, a packaging substrate 103, passive devices 105, an interposer 107, solder balls 111, a lid 113, mold compound 121, thermal interface material (TIM) 123, adhesive 124, and lid standoffs 125A and 125B.

The die 101 may comprise integrated circuit die that have been separated from one or more semiconductor wafers. The die 101 may comprise electrical circuitry such as digital signal processors (DSPs), network processors, power management units, audio processors, RF circuitry, wireless baseband system-on-chip (SoC) processors, sensors, memory, and application specific integrated circuits, for example. In addition, the die 101 may comprise micro-bumps 109 for providing electrical contact between the circuitry in the die 101 and contact pads on the surface of the interposer 107.

The interposer 107 may comprise a semiconductor substrate separated from a wafer, such as a silicon wafer, with through-silicon-vias (TSVs) 115 that provide electrically conductive paths from one surface of the interposer 107 to the opposite surface. The interposer 107 may also comprise backside bumps 117 for making electrical and mechanical contact to the packaging substrate 103. In another example scenario, the interposer 107 may comprise glass or an organic laminate material, either of which may be capable of large panel formats on the order of 500×500 mm, for example.

The packaging substrate 103 may comprise a mechanical support structure for the interposer 107, the die 101, the passive devices 105, and the lid 113. The packaging substrate 103 may comprise solder balls 111 on the bottom surface for providing electrical contact to external devices and circuits, for example. The packaging substrate 103 may also comprise conductive traces in a non-conductive material for providing conductive paths from the solder balls to the die 101 via pads that are configured to receive the backside bumps 117 on the interposer 107. Additionally, the packaging substrate 103 may comprise pads 119 for receiving the solder balls 111. The pads 119 may comprise one or more under-bump metals, for example, for providing a proper electrical and mechanical contact between the packaging substrate 103 and the solder balls 111.

The passive devices 105 may comprise electrical devices such as resistors, capacitors, and inductors, for example, which may provide functionality to devices and circuits in the die 101. The passive devices 105 may comprise devices that may be difficult to integrate in the integrated circuits in the die 101, such as high value capacitors or inductors. In another example scenario, the passive devices 105 may comprise one or more crystal oscillators for providing one or more clock signals to the die 101.

The lid 113 may comprise metal or other thermally conductive material such as ceramic or AlSiC, for example, and may provide a hermetic seal for the devices within the cavity defined by the lid 113 and the packaging substrate 103. A thermal interface may be created for heat transfer out of the die 101 to the lid 113 via the thermal interface material 123, which may also act as an adhesive in addition to the adhesive 124 that bonds the lid 113 to the packaging substrate 103. The adhesive 124 may comprise an epoxy and/or thermal interface material and may be placed at or near the outer edges of the lid 113 and the packaging substrate 103 and the thermal interface material 123B may be placed between the lid 113 and the semiconductor die 101.

The standoffs 125A may be formed in the lid 113 along the outer edges of the lid 113 where it may be bonded to the packaging substrate 103. The standoffs 125B may also be formed as extended regions of the lid 113, extending down from the inside of the lid and beyond the thermal interface material 123. The standoffs 125B may be centered at or near each edge of the lid 113, as illustrated by the standoffs 225A-225D in FIG. 2 or in symmetric positions along edges of the lid, as shown by the standoffs 325A and 325B in FIG. 3.

In an example scenario, a thermal interface material with a long shelf life that does not require cold storage during transport may enable lid assembly on the manufacturing floor without the need for applying thermal interface material at the time of lid attachment. Such materials may be effectively pre-applied at the thermal interface material vendor. Transport and storage with pre-applied thermal interface material poses a problem with lids, which are commonly stacked during shipping to reduce volume. In addition, lids are typically loaded in a lid attachment machine in a stacked arrangement. Conventional lids would therefore cause the pre-applied thermal interface material to smear and stick to the top of a neighboring lid.

In an example scenario, by stamping a small notch in the lid, thereby forming the standoffs 125A and/or 125B, a small gap may be formed, preventing the lids from smearing pre-applied thermal interface material. Moreover, the stacking arrangement also provides a protective cover for the thermal interface materials during shipment. Pre-applied lids with a lid standoff allow the same lid assembly machine to position lids. Having the thermal interface material vendor pre-apply thermal interface material before receiving lids allows for better material handling control and improves the uniformity of the thermal interface material application process.

Figures 2A, 2B:
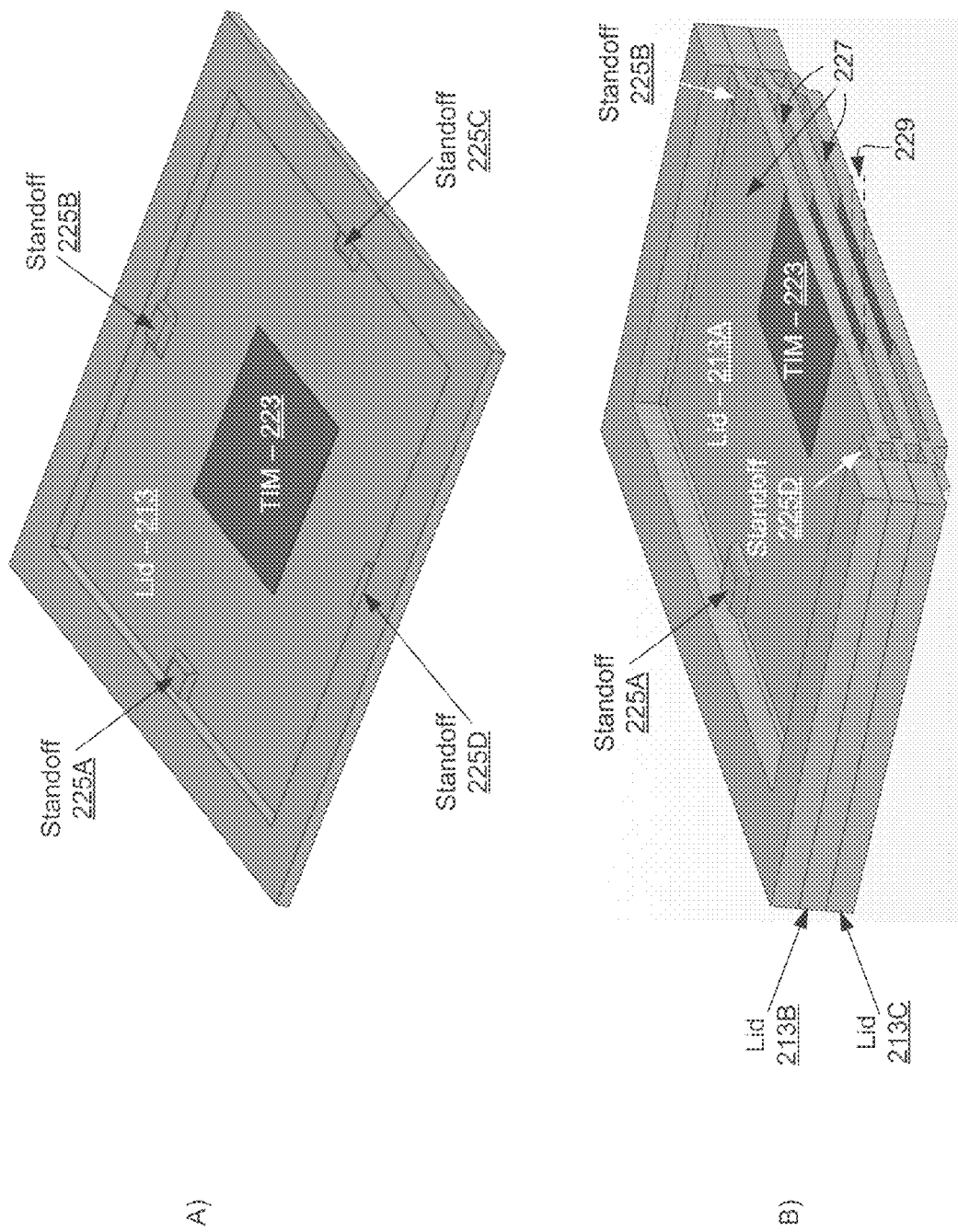
FIGS. 2A and 2B illustrates oblique angle views of semiconductor package lids with standoffs, in accordance with an example embodiment of the disclosure.

FIGS. 2A and 2B illustrate oblique angle views of semiconductor package lids with standoffs, in accordance with an example embodiment of the disclosure. Referring to FIG. 2A, there is shown a lid 213, and stacked lids 213A-213C. Each of the lids 213 and 213A-213C comprises standoffs 225A-225D, although 225C is not shown for lids 213A-213C as they are cross-sections.

Thermal interface material 223 may be formed on the lids 213 and 213A-213C. The thermal interface material 223 may be similar to the thermal interface material 123 described with respect to FIG. 1, and may comprise a material with a long shelf life that does not require cold storage during transport such that it may pre-applied and enable lid assembly on the manufacturing floor without the need for applying thermal interface material at the time of lid attachment.

The standoffs 225A-225D may be formed by being pressed into the metal of the lids 213 and 213A-213C or may be formed at the same time of fabricating the lid structure itself. The standoffs 225A-225D may be of sufficient thickness to avoid contact between a thermal interface material of one lid, e.g., lid 213A, and an opposite surface of another lid, e.g., lid 213B when stacked, as shown by gap 229 in FIG. 2B. As illustrated, the standoffs might be formed at or near a center of each side. However, the standoffs may be placed anywhere along the perimeter of the lids 213, and 213A-213C. Also for example, one or more standoffs might be formed along any or all sides. Additionally for example, one or more standoffs might be formed at the corners. The standoffs might, for example, be formed only along two opposing sides. Further for example, a standoff might comprise a shelf that extends along an entire length of one or more sides. In yet another example, a single standoff may extend an entire perimeter of the lid 213, 213A. The standoff 225A is formed such that, for a plurality of stacked lids 213A-213C, respective tops of respective inner cavities 227 are separated by a gap 229 large enough to allow for thermal interface material 223 to contact only a single package lid of the plurality of stacked package lids 213A-213C.

Figure 3:
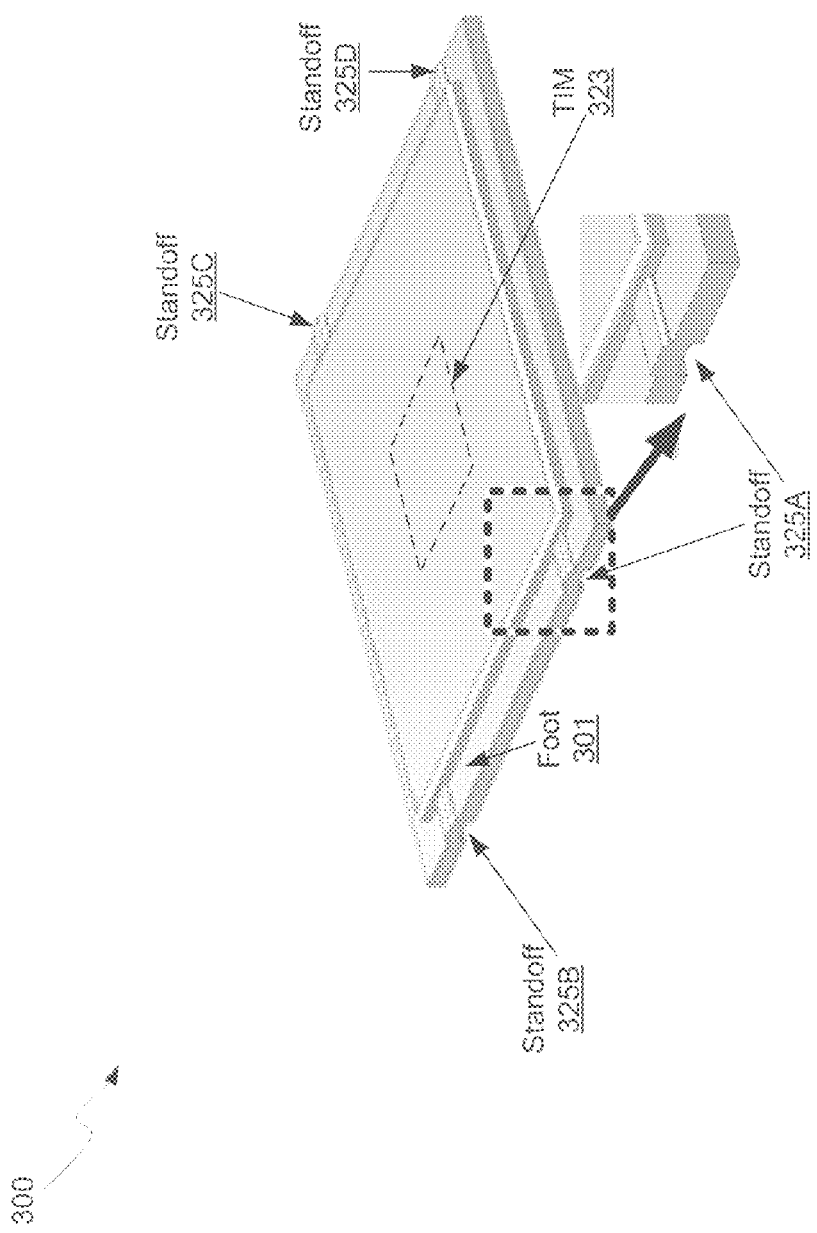
FIG. 3 is a drawing illustrating a semiconductor package lid with standoff features formed in the lid foot, in accordance with an example embodiment of the disclosure.

FIG. 3 is a drawing illustrating a semiconductor package lid with standoff features formed in the lid foot, in accordance with an example embodiment of the disclosure. Referring to FIG. 3, there is shown a semiconductor package lid 300 with a foot 301, pre-applied thermal interface material 323, and standoffs 325A-325D.

The foot 301 may comprise the surface which is to be bonded to a packaging substrate, such as the packaging substrate 103, or other structure to which the lid 300 is to be bonded. As illustrated by the shape of the standoffs 325A-325D, they may be formed by a stamping or coining process that raises portions of the surface of the foot 301 and leaves a depression in the opposite side. The standoffs 325A-325D may enable stacking lids without contact with the thermal interface materials 323 (underneath, shown by the dashed line), and also may provide tilt control, i.e., ensuring planarity of the lid 300 on a surface to which it is bonded, as shown further in FIG. 4.

Figures 4A, 4B:
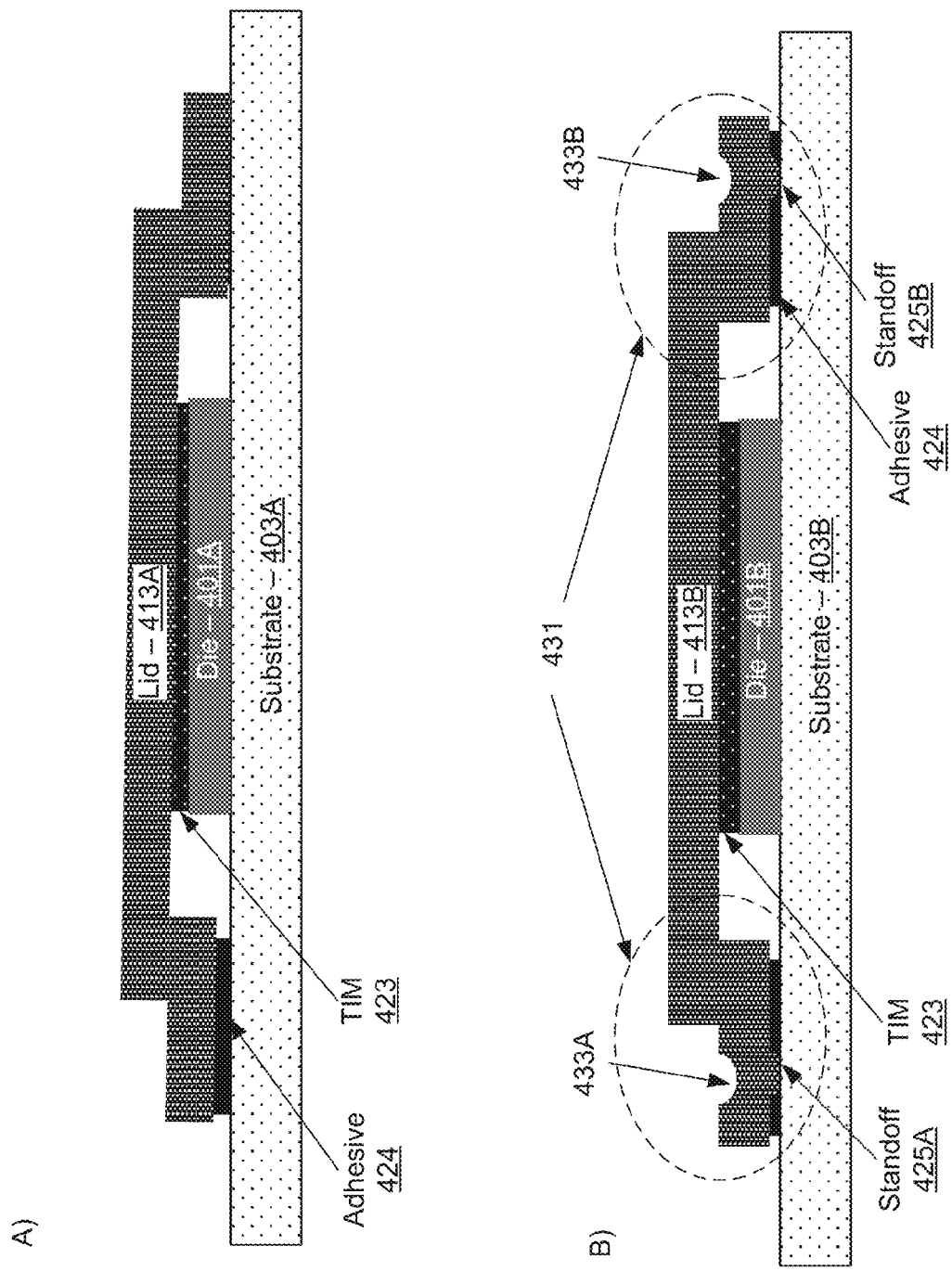
FIGS. 4A and 4B illustrate tilt and tilt control for a semiconductor package lid, in accordance with an example embodiment of the disclosure.

FIGS. 4A and 4B illustrate tilt and tilt control for a semiconductor package lid, in accordance with an example embodiment of the disclosure. Referring to FIGS. 4A and 4B, there is shown a die 401 (e.g., 401A and 401B), a packaging substrate 403 (e.g., 403A and 403B), a lid 413 (e.g., 413A and 413B), and thermal interface material 423, and adhesive 424.

The die 401A and 401B may be similar to the die 101, and accordingly may comprise one or more integrated circuit die that have been separated from one or more semiconductor wafers. The die 401A and 401B may comprise electrical circuitry such as digital signal processors (DSPs), network processors, power management units, audio processors, RF circuitry, wireless baseband system-on-chip (SoC) processors, sensors, memory, and application specific integrated circuits, for example. In another example scenario, the die 401A and 401B may comprise a stack of die or a die/substrate structure, such as the die 101 bonded to the interposer 107 in FIG. 1.

The packaging substrates 403A and 403B may be similar to the packaging substrate 103 and thus may comprise conductive traces and insulating material for providing electrical contact to devices in the die 401A and 401B, respectively. The lid 413B may be similar to the lids described previously, with standoffs 425A and 425B formed in the foot of the lid 413B, as described previously with respect to FIG. 3. Thus, the standoffs 425A and 425B may provide a set separation between the lid 413B and the die 401B.

Without a set separation between a lid and the die it covers, the lid might not be exactly parallel to the die when bonded using the thermal interface material 423A alone. With the standoffs 425A and 425B of the lid 413B embedded within the adhesive 424, which may comprise epoxy and/or thermal interface material, the lid 413B still provides a hermetic seal 431, but also has a set separation defined by the standoff height and thus reproducible flatness with respect to the die 401B and the substrate 403B. For example, standoffs may extend through adhesive 424 to directly contact the substrate. Note that the standoffs 425A and 425B are shown as protrusions from the lid 413B having reciprocating inlets 433A and 433B, or indentations, (e.g., from a stamping, pressing or coining process), but such reciprocating inlets 433 need not be present. Additionally, the standoffs 425A and 425B may be placed at intervals around the lid 413B, at the center of each side of the lid 413B, at corners of the lid 413B, on two to four sides of the lid 413B, and/or entirely around a perimeter of the lid 413B, etc. The standoffs may be formed anywhere along a perimeter of the lid 413B.

Figure 5:
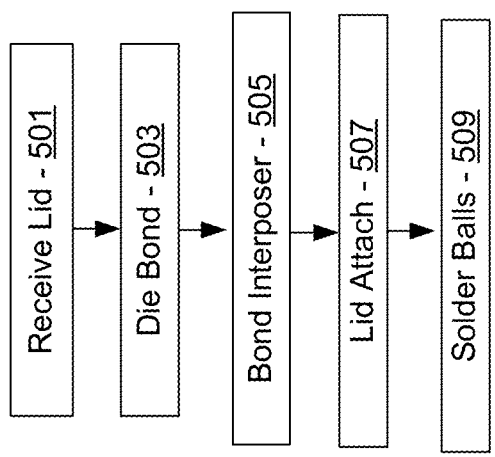
FIG. 5 is a flow chart illustrating a method for utilizing semiconductor packaging lids with pre-applied thermal interface material, in accordance with an example embodiment of the disclosure.

FIG. 5 is a flow chart illustrating a method (or process) for utilizing semiconductor packaging lids with pre-applied thermal interface material, in accordance with an example embodiment of the disclosure. The process described in FIG. 5 may correspond to the process described with respect to FIGS. 1-4, for example. In the first step 501, lids may be received with pre-applied thermal interface material. This may be enabled by the thermal interface material comprising material with a long shelf life that does not require cold storage during transport. Thus enabling lid assembly on the manufacturing floor without the need for applying thermal interface material at the time of lid attachment. Such materials may be effectively pre-applied at the thermal interface material vendor. For example, the received lid may comprise one of a plurality of stacked lids having pre-applied TIM and standoffs, as discussed herein. The received lid may, for example, share any or all characteristics of the lids discussed herein.

In step 503, one or more semiconductor die may be bonded to an interposer or other support structure. The die may be bonded using a mass reflow or thermal compression process, for example. A capillary underfill process may be utilized to fill the volume between the die and the interposer. Note that an interposer need not be present. The die and/or interposer may, for example, share any or all characteristics with die and interposers discussed herein.

In step 505, the die and interposer (if present) may be bonded to a packaging substrate, such as the packaging substrate 103, for example, and may comprise a mechanical support structure for the interposer, the die, and any passive devices. The packaging substrate may comprise a surface to which a lid may be bonded. The packaging substrate may also comprise solder balls on the bottom surface for providing electrical contact to external devices and circuits, for example. The substrate may, for example, share any or all characteristics with substrates discussed herein.

In step 507, a lid with pre-applied thermal interface material may be bonded to the packaging substrate and the top surface of the one or more die (e.g., bonded to the interposer), for example providing a hermetic seal for the die and other devices bonded to the packaging substrate, as well as providing a path for conductance of heat out of the die. The lid may comprise metal for proper heat conduction and sinking. In addition, standoffs in the lid may provide tilt control for bonding the lid to a substrate and/or may provide spacing between stacked lids so as not to smear thermal interface material.

In step 509, solder balls may be formed on the packaging substrate, if not formed prior to the lid attachment step, thereby resulting in the completed package, as illustrated in FIG. 1, for example. Though not shown, other attachment and/or electrical connections structures may be used.

In an embodiment of the disclosure, a system is disclosed for semiconductor package lid thermal interface material standoffs. In this regard, aspects of the disclosure may comprise a substrate, one or more semiconductor die bonded to the substrate, and a lid bonded to the substrate and the one or more semiconductor die, wherein the lid comprises pre-applied thermal interface material and standoffs that define a distance between the lid and the substrate. The package lid may comprise metal. The standoffs may be within a portion of the pre-applied thermal interface material. The package lid may provide a hermetic seal with the substrate. One or more passive devices may be bonded to the substrate and covered by the package lid. Standoffs may also be formed on portions of the lid that are not in contact with the substrate. The standoffs may, for example, be formed on four edges of the package lid. The standoffs may, for example, comprise structures pressed into the package lid.

While the disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:

1. A semiconductor package comprising:
   a substrate;
   a semiconductor die bonded to the substrate;
   a package lid comprising:
      a foot that is bonded to the substrate; and
      a plurality of standoffs extending from the foot of the package lid and spaced around a perimeter of the foot of the package lid, and that define a distance between the package lid and the substrate, wherein the package lid is bonded to the semiconductor die; and
   thermal interface material (TIM) in contact with the semiconductor die,
   wherein:
      the package lid bonded to the substrate provides a hermetic seal with the substrate, and
      the package lid is configured such that, when stacked with a second package lid comprising a second TIM, the standoffs contact the second package lid and thereby define a gap that maintains at least the TIM separated from the second package lid or the second TIM separated from the package lid.

2. The semiconductor package according to claim 1, wherein the package lid comprises a thermal conducting material.

3. The semiconductor package according to claim 1, wherein at least one of the plurality of standoffs is at least partially bounded by an adhesive bonding the package lid to the substrate.

4. The semiconductor package according to claim 1, wherein a passive device is bonded to the substrate and is covered by the package lid.

5. The semiconductor package according to claim 1, wherein the package lid comprises another standoff that is not one of the plurality of standoffs, wherein the another standoff is also formed on one or more portions of the package lid and is not in contact with the substrate.

6. The semiconductor package according to claim 1, wherein—one or more of the plurality of standoffs are positioned at or near a center of a respective side of the package lid.

7. The semiconductor package according to claim 1, wherein each of the plurality of standoffs corresponds to a reciprocal indentation in the package lid reciprocal with and directly across a thickness of the package lid from the corresponding standoff.

8. A semiconductor package comprising:
a packaging substrate;
an interposer bonded directly to the packaging substrate;
a semiconductor die bonded directly to the interposer;
a package lid bonded directly to the packaging substrate and bonded directly to the semiconductor die, the package lid comprising a plurality of standoffs non-continuous to each other and spaced around a perimeter of the package lid, the plurality of standoffs being bonded directly to the packaging substrate, and wherein the plurality of standoffs comprises at least four standoffs; and
thermal interface material (TIM) bonding the package lid to the semiconductor die,
wherein the package lid is configured such that, when stacked with a second package lid comprising a second TIM, the standoffs contact the second package lid and thereby define a gap that maintains at least the TIM separated from the second package lid or the second TIM separated from the package lid.

9. The semiconductor package according to claim 8, wherein the package lid comprises a thermal conducting material.

10. The semiconductor package according to claim 8, wherein at least one of the plurality of standoffs is bounded on multiple sides by an adhesive that bonds the package lid to the substrate.

11. The semiconductor package according to claim 8, wherein the package lid comprises another standoff that is not one of the plurality of standoffs, wherein the another standoff is positioned directly above the substrate and is not directly coupled to the substrate or to any electronic component.

12. The semiconductor package according to claim 8, wherein the plurality of standoffs are formed on, at, or near one or more edges of the package lid.

13. The semiconductor package according to claim 8, wherein at least one of the plurality of standoffs corresponds to a reciprocal indentation in the package lid reciprocal with and directly across a thickness of the package lid from the corresponding standoff.

14. A method for forming a semiconductor package, the method comprising:
bonding a semiconductor die to a packaging substrate; and
bonding a first package lid to the packaging substrate and the semiconductor die,
wherein the first package lid comprises:
thermal interface material (TIM) that is in contact with the semiconductor die;
standoffs located on and spaced around a perimeter of the first package lid, the first package lid being bonded to the semiconductor die and the packaging substrate; and
indentations reciprocal with and directly across a thickness of the first package lid from the standoffs,
wherein the first package lid is configured such that, when stacked with a second package lid comprising a second TIM, the standoffs contact the second package lid and thereby define a gap that maintains at least the first TIM separated from the second package lid or the second TIM separated from the first package lid.

15. The method according to claim 14, wherein the first package lid comprises an inner cavity in which the semiconductor die is positioned and in which at least one of the standoffs is located.

16. The method according to claim 14, wherein there is a gap between at least one of the standoffs and the substrate.

17. A semiconductor package comprising:
a semiconductor die bonded to a packaging substrate; and
a first package lid bonded to the packaging substrate and the semiconductor die,
wherein the first package lid comprises:
thermal interface material (TIM) that is in contact with the semiconductor die;
standoffs located on and around a perimeter of the first package lid, the first package lid being bonded to the semiconductor die and the packaging substrate; and
indentations reciprocal with and directly across a thickness of the first package lid from the standoffs,
wherein the first package lid is configured such that, when stacked with a second package lid comprising a second TIM, the standoffs contact the second package lid and thereby define a gap that maintains at least the first TIM separated from the second package lid or the second TIM separated from the first package lid.

18. The semiconductor package according to claim 17, wherein the first package lid comprises an inner cavity in which the semiconductor die is positioned and in which at least one of the standoffs is located.

19. The semiconductor package according to claim 17, wherein there is a gap between at least one of the standoffs and the substrate.

* * * * *